United States Patent [19]

Diefendorff

[11] Patent Number: 5,329,489
[45] Date of Patent: Jul. 12, 1994

[54] DRAM HAVING EXCLUSIVELY ENABLED COLUMN BUFFER BLOCKS

[75] Inventor: Keith E. Diefendorff, Austin, Tex.

[73] Assignee: Texas Instruments Incorporated, Dallas, Tex.

[21] Appl. No.: 852,939

[22] Filed: Mar. 13, 1992

Related U.S. Application Data

[63] Continuation of Ser. No. 639,309, Jan. 7, 1991, abandoned, which is a continuation of Ser. No. 175,875, Mar. 31, 1988, abandoned.

[51] Int. Cl.$^5$ .............................................. G11C 8/00
[52] U.S. Cl. .............................. 365/189.05; 365/230.03
[58] Field of Search ................... 365/189.04, 189.05, 365/189.12, 230.03, 230.05, 230.09, 239, 240

[56] References Cited

U.S. PATENT DOCUMENTS

| 4,577,293 | 3/1986 | Matick et al. | 365/230.03 |
|---|---|---|---|
| 4,633,440 | 12/1986 | Pakulski | 365/230.09 |
| 4,639,890 | 1/1987 | Heilveil et al. | 365/230.09 |
| 4,646,270 | 2/1987 | Voss | 365/230.09 |
| 4,725,945 | 2/1988 | Kronstadt et al. | 364/200 |
| 4,757,473 | 7/1988 | Kurihara et al. | 365/189.12 |
| 4,802,132 | 1/1989 | Ohsawa | 365/230.03 |
| 4,825,411 | 4/1989 | Hamano | 365/230.05 |
| 4,855,959 | 8/1989 | Kobayashi | 365/230.03 |
| 4,894,770 | 1/1990 | Ward et al. | 365/230.03 X |
| 5,163,024 | 11/1992 | Heilveil et al. | 365/230.09 |

OTHER PUBLICATIONS

Smith, "Cache Memory Design: An Evolving Art," Spectrum vol. 24, No. 12 (IEEE, 1987), pp. 40-44.
Ward, S. and Zak, R., "Static-column RAM as Virtual Cache", Laboratory for Computer Science, MIT, Cambridge, Mass.

Primary Examiner—Joseph L. Dixon
Assistant Examiner—Michael A. Whitfield
Attorney, Agent, or Firm—John C. Crane; Wade James Brady, III; Richard L. Donaldson

[57] ABSTRACT

A random access array memory device which uses a static buffer as a cache for speeding the access times achievable for data retrieval from the device. The static buffer is operationally divided into two or more blocks so that each block holds a block of data from a different row of the array. The division of a single buffer into several operational blocks significantly increases the "hit" probability of the cache, allowing fast access from the buffer. A control system stores the row address (TAG) of each of the multiple blocks and compares that address to the row address of the data desired and signals the result of that comparison. Random access memory arrays of the multiple line cache configuration are employed in data processing systems including a CPU, address and data buses, control logic, and multiplexers.

7 Claims, 3 Drawing Sheets

DRAM HAVING EXCLUSIVELY ENABLED COLUMN BUFFER BLOCKS

This application is a continuation of application Ser. No. 07/639,309, filed Jan. 7, 1991 now abandonded which is a continuation of application Ser. No. 07/175,875 filed Mar. 31, 1988 now abandoned.

TECHNICAL FIELD OF THE INVENTION

The instant invention pertains to semiconductor memories, particularly to dynamic random access memory arrays (DRAMs) of the static column decode (SCD) type and to systems employing such devices.

BACKGROUND OF THE INVENTION

Various elements of data processing systems have understandably advanced at differing rates and in differing directions in recent years. Processors, specifically microprocessors, have become more powerful and much faster, being able to run at very high clock speeds. Memories, on the other hand, have not become significantly faster but have increased many fold their bit size and reduced their cost per bit. This generalization is particularly true for dynamic random access memories (DRAMs). So to enable these high density memories to be accessed at a speed more compatible with the speed which a microprocessor can call for, use, and send back data, many strategies have been proposed and developed. One such strategy has been to utilize a cache memory to store portions of data from the main memory systems. This strategy can well succeed when at least two conditions are met. The two conditions are that the memory used as cache memory has significantly faster access time than the main memory and that the portion of data stored in this cache memory has a high probability of being accessed by the microprocessor, in term of art, "hit". Implementation of these cache memory systems has been well developed in the art.

Static random access memory (SRAM) devices have been used for cache memory because of their fast access times relative to DRAM memories. A typical access time, for example, for a DRAM is 120 nanoseconds while access for an SRAM memory is typically 20 to 40 nanoseconds. However, SRAM device architecture requires presently a high chip space/bit ratio, hence, they are largely unsuitable for high density main storage devices. Also SRAM devices typically consume significantly higher power than comparable DRAM devices.

It has been proposed, however, that SRAM cache memories be located on DRAM memory arrays. This approach offers some solution to the speed problem encountered in accessing DRAM devices. The drawbacks of this approach are as follows: 1) In order to achieve a high probability of hits it has been believed that a relatively large cache had to be constructed. Because of the space needed for SRAM cells, building a reasonably sized cache on a DRAM chip took unacceptable space. 2) The logic and register support necessary to implement a cache memory system also occupies significant physical space on a chip. This additional space is probably not acceptable on a DRAM chip but to locate this off-chip would sacrifice the speed advantages of on-chip placement by requiring a bus interconnect and foregoing most parallel communication.

Goodman and Chiang, "The Use of Static Column RAM as a Memory Hierarchy," The 11th Annual Symposium on Computer Architecture, IEEE Computer Society Press, 1984, pp. 167–174, suggest the use of the sense-amplifying row or static row buffer of the modern static column decode DRAM device as a cache memory. This suggestion solves the problem of using space unacceptably on a chip for low density SRAM cache memory since the static row buffer is already present on the device. This approach suffers the serious drawback, however, that it offers only one row of cache memory, albeit the row contains a number of memory cells equal to the number of the main memory, DRAM, array columns. Therefore the "hit" probability is typically not acceptably high.

A further refinement of the Goodman and Chiang suggestion is to use "by 2" or "by 4" memory devices instead of "by 1" devices. In other words, for example, to get 1M bit capacity instead of using one DRAM array having 1024×1024 memory cells with one static row buffer, 1024 cells in length, in one device, use a device having four 256K bit arrays having 512×512 memory cells and each having a static row buffer 512 cells in length. This configuration allows four separately addressable "cache" rows by using the four static row buffers. However this solution has the drawbacks that such "by 4" devices are more costly and less available than "by 1" devices, the "by 4" devices are extremely difficult to error correct using standard error correcting codes and procedures, "by 4" devices require more I/O pins and therefore a larger physical package than "by 1" devices, "by 4" devices consume more power than "by 1" devices, they require more on-chip addressing logic, they require off-chip addressing or demultiplexing functions above that required by "by 1" arrays, and they could require more than twice the physical space to house the four static row buffers than the "by 1" devices.

BRIEF DESCRIPTION OF THE INVENTION

It has been commonly understood that, in order to achieve a high hit ratio in a cache memory system, a large cache in terms of number of memory cells is required. However, the Inventor has discovered, through statistical modeling analysis and actual software runs, that for conventional microprocessor systems running conventional software, that the number of separate segments of a memory array cached in the cache system is much more critical to the hit ratio of the cache than the length of the segments. A line of, for example, 1024 memory cells, cached from a single memory array row does not have significantly greater chance of a hit during a conventional processing run than a cache of 512 memory cells in length or even a cache line of 256 memory cells in length. This is apparently because conventional microprocessors and software require access to memory locations in a sequential fashion quite frequently but these sequential accesses are interrupted by the need for random bit accessing and due to bi- and tri-modal addressing execution frequently employed in memory operation. These interruptions, of course, would cause dumping of the entire cache row in a single line cache system.

The result of this analysis is that the Inventor has discovered that a cache composed of two separately stored and accessed blocks or sections 512 memory cells long has a much higher hit probability than a singly stored and accessed block or section 1024 memory cells long, for example. Also, four such blocks or sections each 256 memory cells in length attains a much higher hit ratio than either the one or two block configuration above even though the total number of memory cells remains constant. The progressively more blocks with less cells per block continues to be more efficient at increasing the hit ratio of the cache formed but after the number of blocks reaches approximately sixteen, the logic and control necessary to address and access each block becomes burdensome relative to the additional hit ratio achieved, although further refinement of such control is contemplated to make more blocks practical.

The instant invention provides for a conventional RAM array having a static row buffer operationally extending across the width of the device wherein the static row buffer is operationally divided into two or more blocks or sections. These blocks or sections then provide multiple cache lines for the RAM array which are accessible without addressing the array itself.

The instant invention provides for a data processing system employing multiple sectioned or blocked cache line CDRAMs.

By this invention, unacceptable chip space is not required for establishing a workable cache.

Further by the instant invention the cache is established on chip so that parallel movement of data signals may be established easily.

Further by the present invention a multiple line cache is established without resort to use of "by 2," "by 4," or "by n" devices.

Also the instant invention provides a cache memory system that maintains a high "hit" probability.

Further, the instant invention accomplishes a fast access to data signals by utilizing static RAM elements.

These advantages and others inherent in the invention will be evident by the description and figures which follow.

BRIEF DESCRIPTION OF THE DRAWING FIGURES

DETAILED DESCRIPTION OF THE INVENTION

Figure 1:
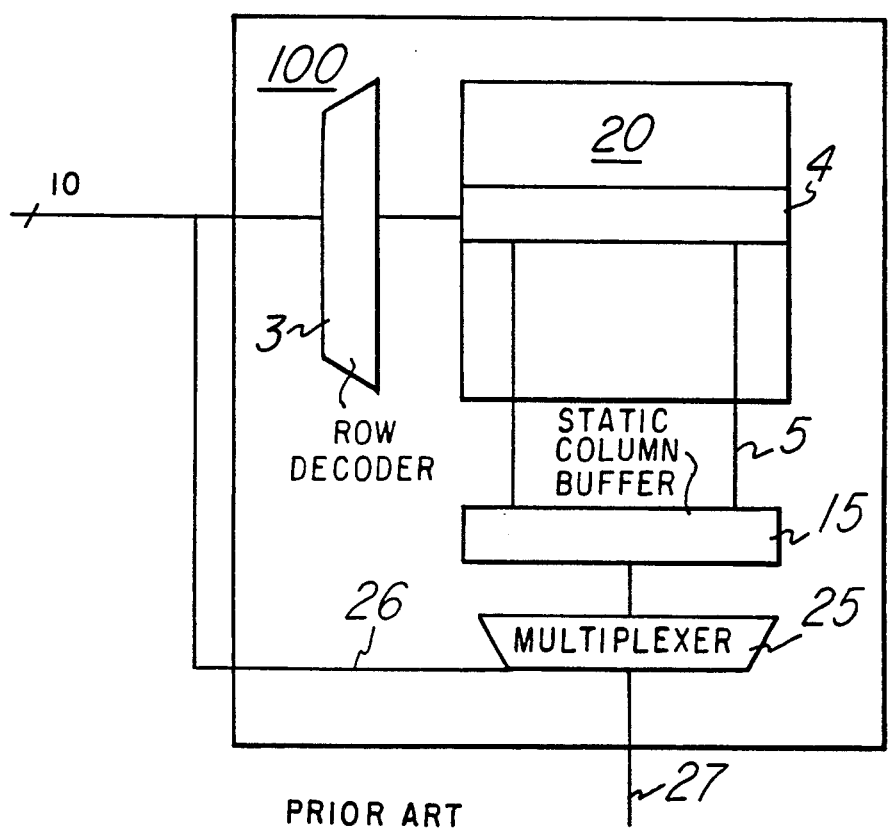
FIG. 1 is a block diagram of the conventional SCD DRAM of the prior art.

Referring to FIG. 1, a conventional static column decode dynamic random access memory array 100 is shown in block diagram. A memory cell array 20 having n rows and m columns of cells of dynamic random access memory is connected by m parallel connecting paths, schematically represented at 5, to a static column decode buffer (SCD) 15. In communication with the SCD buffer is a column data multiplexer 25. Column data multiplexer 25 has address input lines A0–A10 for example representatively shown by device bus 26. Also having as input A0–A10 is row address multiplexer 27. The static column decode dynamic access memory array operates in a known manner to store and access data in a data processing system as is well known in the prior art. The conventional operation of the SCD DRAM device and system as are well known, form no part of the instant invention except as modified by the description herein.

Figure 2:
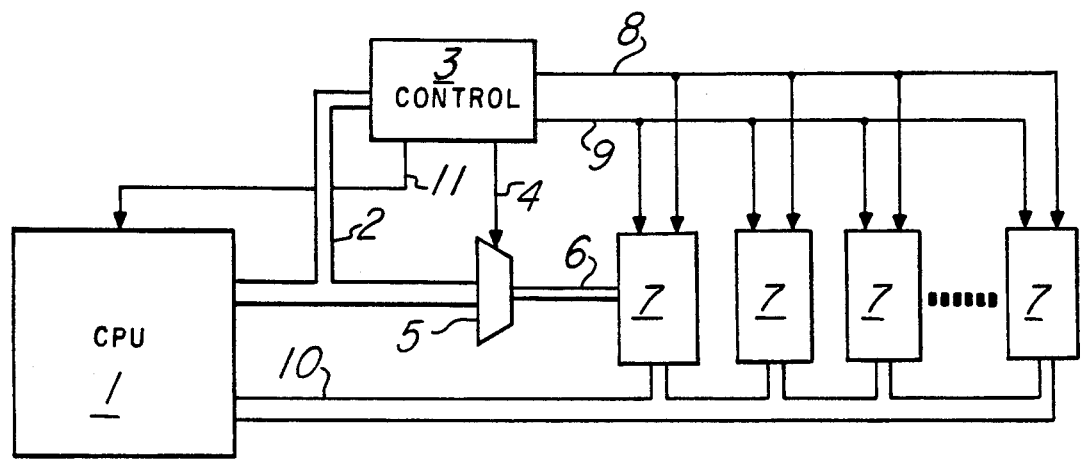
FIG. 2 is a functional block diagram of a data processing system according to the invention.

A system embodying the invention will now be described with reference to FIG. 2. The system includes Central Processing Unit (CPU) 1 having address bus 2 connected to a cache/DRAM controller 3 and to a row/column address multiplexer 5. The cache/DRAM controller 3 has a MISS signal output 11 connected back to the CPU 1, a row/column address output 4 connected to the row/column multiplexer 5, a row address strobe output 8, and a column address strobe output 9, both of these latter outputs being connected to each of several DRAM devices 7. The row/column address multiplexer 5 has as an output a multiplexed row/column address bus 6 which is connected also to each of several DRAM devices 7. The DRAM devices 7 output data via CPU data bus 10 to the CPU 1.

Figure 3:
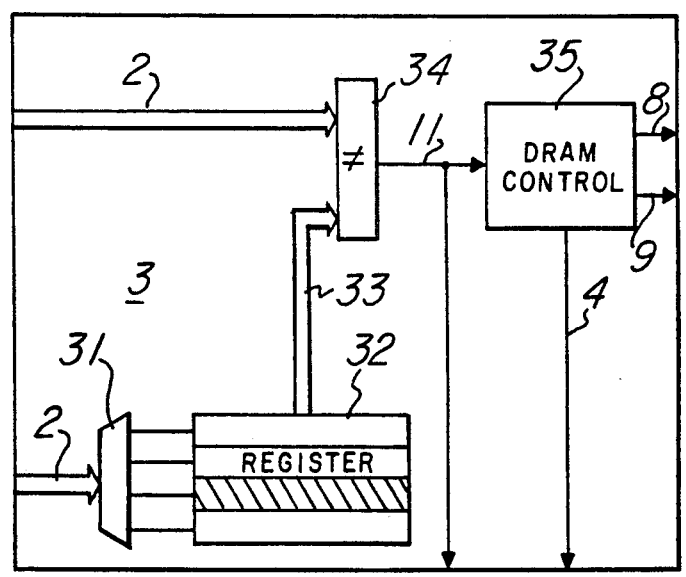
FIG. 3 is a more detailed block diagram of the cache/DRAM controller of FIG. 2.

Further explanation of the cache/DRAM controller of block 3 will now be made with reference to FIG. 3. The CPU address bus 2 is connected to a comparator 34 and to a block address demultiplexer 31. The block address demultiplexer 31 is operationally connected to separate registers of a TAG register file 32 which stores a row address representation for each block section of the segmented static column buffer. The TAG register file 32 is in communication by TAG address bus 33 with comparator 34.

Comparator 34 outputs a MISS signal by output line 11 back to the CPU 1 and to the DRAM controller 35. DRAM controller 35, the operation of which is well known in the art and is therefore not more specifically described, has outputs 8, the Row Address Strobe (RAS), 9, the Column Address Strobe (CAS) 4, and a row/column address selector. The RAS and CAS signal lines are connected to each of the DRAMs 7 and the row/column address selector 4 is input to the row/column address multiplexer 5.

Figure 4:
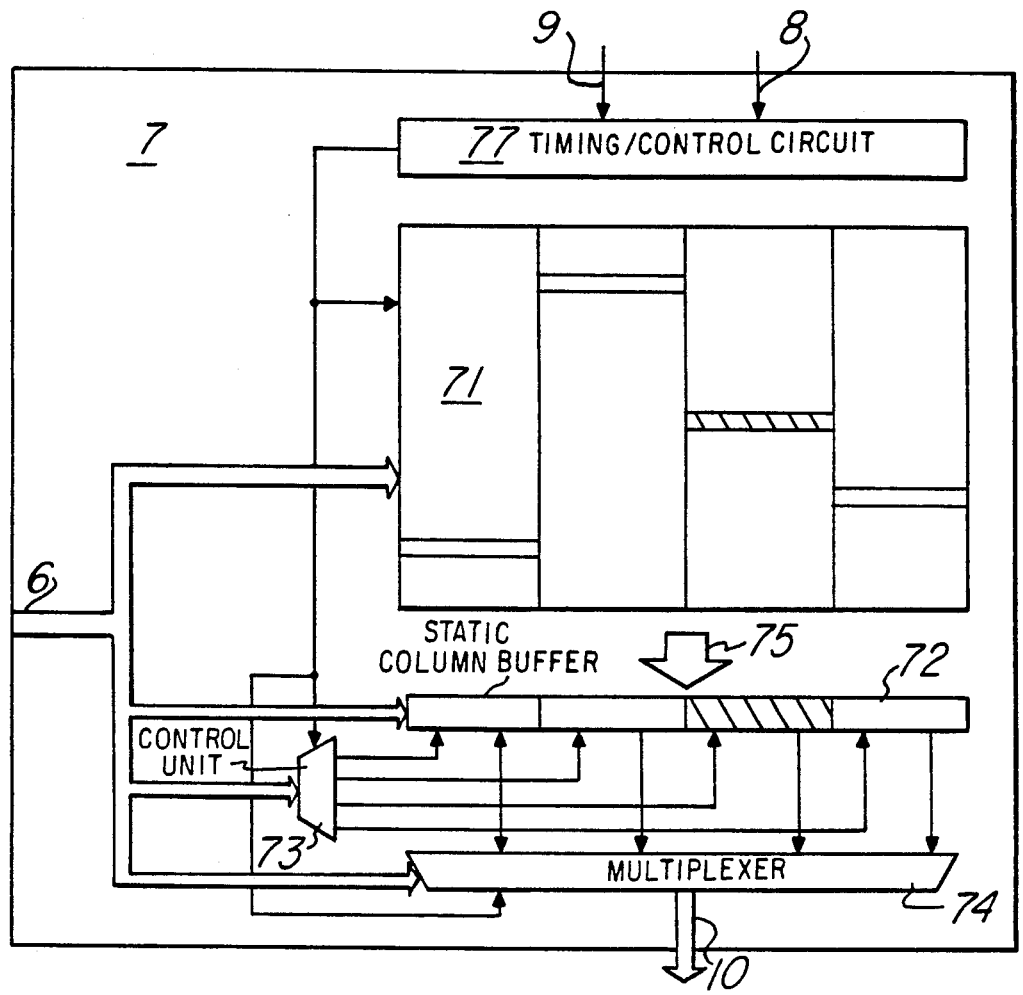
FIG. 4 is a more detailed functional block diagram of the multiple cache line DRAM from FIG. 2 according to the invention.

The DRAM device according to the invention will now be described with reference to FIG. 4. The DRAM comprises a charge array 71 of known configuration. It is pointed out however, that the array may also be of the static random access variety within the contemplation of the invention. The time multiplexed row/column address signal is input to the device via the bus 6. A timing and control circuit 77 receives the RAS and CAS signals 8 and 9 and the other control signals as are known to be necessary for the operation of the DRAM but which are not shown here for the sake of simplicity, such as a READ/WRITE signal, for example. In parallel communication with the charge array 71, via circuit lines 75, is a static column buffer 72 typically composed of sense amplifier cells. It is pointed out that the charge array 71 of the invention is pictorially shown here divided into four blocks. In practice, the charge array, composed operationally of n rows of m memory cells arranged in m columns, is usually not physically divided into blocks, although in some cases it may be. The division lines are shown here to facilitate the explanation of the operation of the device. Likewise, the static column buffer 72 is shown divided into four corresponding blocks by dividing lines. These lines are not meant to indicate a physical division of the static column buffer 72, but an operational division which will be further clarified. Each operational block of the static column buffer 72 is connected to a block address demultiplexer and control circuit 73 and also connected to a column address control and multiplexer circuit 74. The column address control and multiplexer circuit is connected to the CPU data bus 10.

Figure 5:
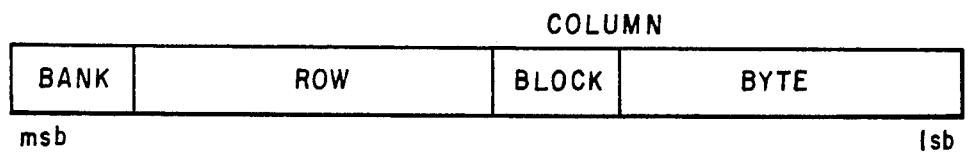
FIG. 5 is a representation of the CPU address depicting address fields.

The operation of the system will now be explained with reference to FIGS. 2-5. At the start of a memory READ cycle, e.g., from the CPU 1, the cache/DRAM controller default selects, by connection 4 to the row/-column address multiplexer, the column address from the CPU address bus 2. The address is broken into fields for example as illustrated in FIG. 5. This address is multiplexed onto the DRAM address bus 6. The RAS and CAS are default held active on lines 8 and 9 so that the DRAM, as is known, is in static access mode. The cache/DRAM controller 3 decodes the block address field from the CPU address and selects the register of the TAG address register file 32 uniquely associated with the decoded block address and uniquely associated with the addressed block of the static column buffer 72. The TAG register contains a row address corresponding, of course, to the row address of the charge array 71 from which the block of data presently in that block of the static column buffer 72 was sensed. The TAG address from the TAG register file 32 is output to a comparator 34 where it is compared to the CPU row address input to the comparator 34 on bus 2. If the row address and tag address are equal, this indicates a cache hit. If the addresses are not equal, a cache miss is indicated and the comparator outputs a miss signal on miss line 11.

If a hit is indicated, the cache/DRAM controller takes no further action, since during these actions in the controller 3, the column address was being used by the DRAMs to select a data bit out of the Static Column Buffer 72. The data is passed out of the DRAM to the CPU data bus 10 and the CPU completes its memory cycle.

On detecting a miss, the miss signal output by the controller 3 on the miss line 11 signals the CPU 1 that it will have to wait on data. The data on the data bus 10 will be ignored if timing of the system is such that the data is already on the data bus. The miss signal is also sent to the DRAM controller 35 which then operates to resolve the miss in the following manner. The RAS and CAS signals on lines 8 and 9 are deactivated to cause, as is known, the DRAM to precharge. The DRAM controller 35 then causes the row/column multiplexer to assert the row address field to the DRAM and activates the RAS signal on line 8. This causes the DRAM to get an entire row of data from the addressed row of the array 71 and send it to the static column buffer 72. The DRAM controller 35 then causes the row/column multiplexer 5 to multiplex the column address field to the DRAM and activates CAS on line 9. The DRAM decodes the block address by the block address demultiplexer 73 and enables the corresponding block of the Static Column Buffer 72 to load the corresponding data block of columns from the array 71. The other blocks of data are not loaded into the Static Column Buffer. The DRAM controller also loads the new row address into the corresponding register of the TAG register file 32. The column address field is then used to output the correct data bit to the CPU data bus 10 and the cache/-DRAM controller signals the CPU to accept the data.

The operation of the system employing the invention has been described with respect to a READ cycle. A WRITE cycle may be executed in a conventional manner well known in the art essentially without regard for the multiple line buffer configuration, except that the cache/DRAM controller 35 will be required to update the TAG register file to accommodate changes in the row of the block data stored in the static column buffer 22.

Various modifications of the disclosed preferred embodiment are contemplated which are within the scope of the invention. These modifications include, but are not limited by the examples to follow. Various elements of the cache/DRAM controller 3 may be included on or associated with each memory device 7 such as the TAG register files 32, the comparator 34 or the DRAM controller 35. Of course, this inclusion would necessitate multiplication of these circuits which may not be acceptable for multiple memory device systems. As noted before, the memory devices utilized with the inventive system need not be DRAM devices. The logic and control circuits may include the capability of making a decision whether to replace or retain data in the static column buffer 72. Buses 2 and 10 may be electrical, optical, or other electromagnetic vias. The comparison of the TAG address to the CPU row address may be made in different ways, such as by tagging each row of the array with a block TAG code. Instead of direct mapping of the cache blocks to specific blocks of the memory array, an embodiment of the invention is contemplated in which cache blocks are associated with any of the blocks of the array as determined by a logical operation to increase the hit rate of the cache. This has been referred to as a set-associative strategy. Other modifications are envisioned which are within the scope of the claims to follow.

I claim:

1. A memory device comprising:
an array of individual, randomly accessed memory cells operatively arranged in rows and columns, said columns operationally divided into a multiplicity of data blocks,
a static column buffer operationally divided into a multiplicity of buffer blocks, one each of said multiplicity of data blocks associated with one each of said multiplicity of buffer blocks wherein during a data transfer cycle each of said multiplicity of data blocks is coupled to said corresponding buffer block but only one of said multiplicity of data blocks is latched into said corresponding buffer block; and
means for exclusively outputting said one latched buffer block of said static column buffer.

2. The memory device of claim 1 wherein:
the memory device is a static column decode dynamic random access memory.

3. The memory device of claim 1 wherein:
the static buffer comprises a row of static random access memory cells.

4. The memory device of claim 1 wherein:
the buffer further comprises a single operative line of n memory cells, n equals the number of columns of the array, and divided into s sections, s is greater than 1.

5. The memory array of claim 5 wherein:
s equals four and each section contains n/4 memory cells.

6. The memory array of claim 5 wherein:
s equals eight and each section contains n/8 memory cells.

7. A memory device comprising:
an array of individual memory cells operatively arranged in (n) rows and (m) columns, each of said columns operationally divided into a multiplicity of data blocks;

a static column buffer having at least (m) locations coupled to said array for receiving (m) data signals from a row of memory cells of said array, said buffer being operationally divided into a multiplicity of buffer blocks each associated with one of said data blocks;

a demultiplexer control circuit for decoding a block address and exclusively gating said data from said memory cells into one said buffer block; and means for outputting the data from said exclusively gated block.

* * * * *